United States Patent
Mirzaei et al.

(10) Patent No.: US 9,742,367 B2
(45) Date of Patent: Aug. 22, 2017

(54) OUTPHASING TRANSMITTER SYSTEMS AND METHODS

(71) Applicant: Avago Technologies General IP (Singapore) Pte. Ltd., Singapore (SG)

(72) Inventors: Alex Ahmad Mirzaei, Irvine, CA (US); Hooman Darabi, Laguna Niguel, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/812,579

(22) Filed: Jul. 29, 2015

(65) Prior Publication Data

US 2017/0033743 A1    Feb. 2, 2017

(51) Int. Cl.
| | |
|---|---|
| *H04B 1/04* | (2006.01) |
| *H03F 3/217* | (2006.01) |
| *H03F 1/56* | (2006.01) |
| *H03F 3/193* | (2006.01) |
| *H03F 1/02* | (2006.01) |
| *H03F 3/24* | (2006.01) |

(52) U.S. Cl.
CPC .......... *H03F 3/217* (2013.01); *H03F 1/0294* (2013.01); *H03F 1/565* (2013.01); *H03F 3/193* (2013.01); *H03F 3/2171* (2013.01); *H03F 3/245* (2013.01); *H03F 2200/339* (2013.01); *H03F 2200/351* (2013.01); *H03F 2200/451* (2013.01)

(58) Field of Classification Search
CPC ................................. H03F 1/0205; H03F 3/217
USPC .......................................................... 455/110
See application file for complete search history.

(56) References Cited

U.S. PATENT DOCUMENTS

| | | | |
|---|---|---|---|
| 7,889,811 B2* | 2/2011 | Byun | H03F 1/0294 375/219 |
| 2003/0107435 A1* | 6/2003 | Gu | H03F 1/0294 330/149 |
| 2004/0027199 A1* | 2/2004 | Wight | H03F 3/211 330/251 |

* cited by examiner

*Primary Examiner* — Sanh Phu
(74) *Attorney, Agent, or Firm* — Sterne, Kessler, Goldstein & Fox P.L.L.C.

(57) ABSTRACT

The present disclosure is directed to a system and method for performing the outphasing technique without using a combiner at the output of two power amplifiers to reduce loss and distortions.

20 Claims, 5 Drawing Sheets

OUTPHASING TRANSMITTER SYSTEMS AND METHODS

FIELD OF THE INVENTION

This application relates generally to outphasing transmitters.

BACKGROUND

Modern wireless transmitters modulate both the phase and amplitude of a carrier to provide high spectral efficiencies. An amplitude modulated carrier has a non-constant envelope that varies in proportion to the data it encodes. In order for a receiver to properly recover the data from such a carrier, the shape of the carrier's envelope should be preserved as much as possible after power amplification at the transmitter.

To this end, wireless transmitters that perform amplitude modulation generally use a linear power amplifier to increase the power level of the modulated carrier before the carrier is transmitted over a channel to a receiver. In contrast to a non-linear power amplifier, the output of a linear power amplifier is proportional to its input. Thus, the shape of the carrier's envelope is preserved at the output of the linear power amplifier along with the data it encodes. Power amplification is used, for example, to overcome losses of the channel and provide immunity against noise.

Linearity and power efficiency are generally competing performance metrics of conventional power amplifiers. In other words, conventional power amplifiers are generally either highly linear or highly power efficient, but not both. In portable communication devices, such as cell phones and laptops, this tradeoff can result in shorter battery lifetime because the linearity requirement generally takes priority over power efficiency.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

Figure 5:
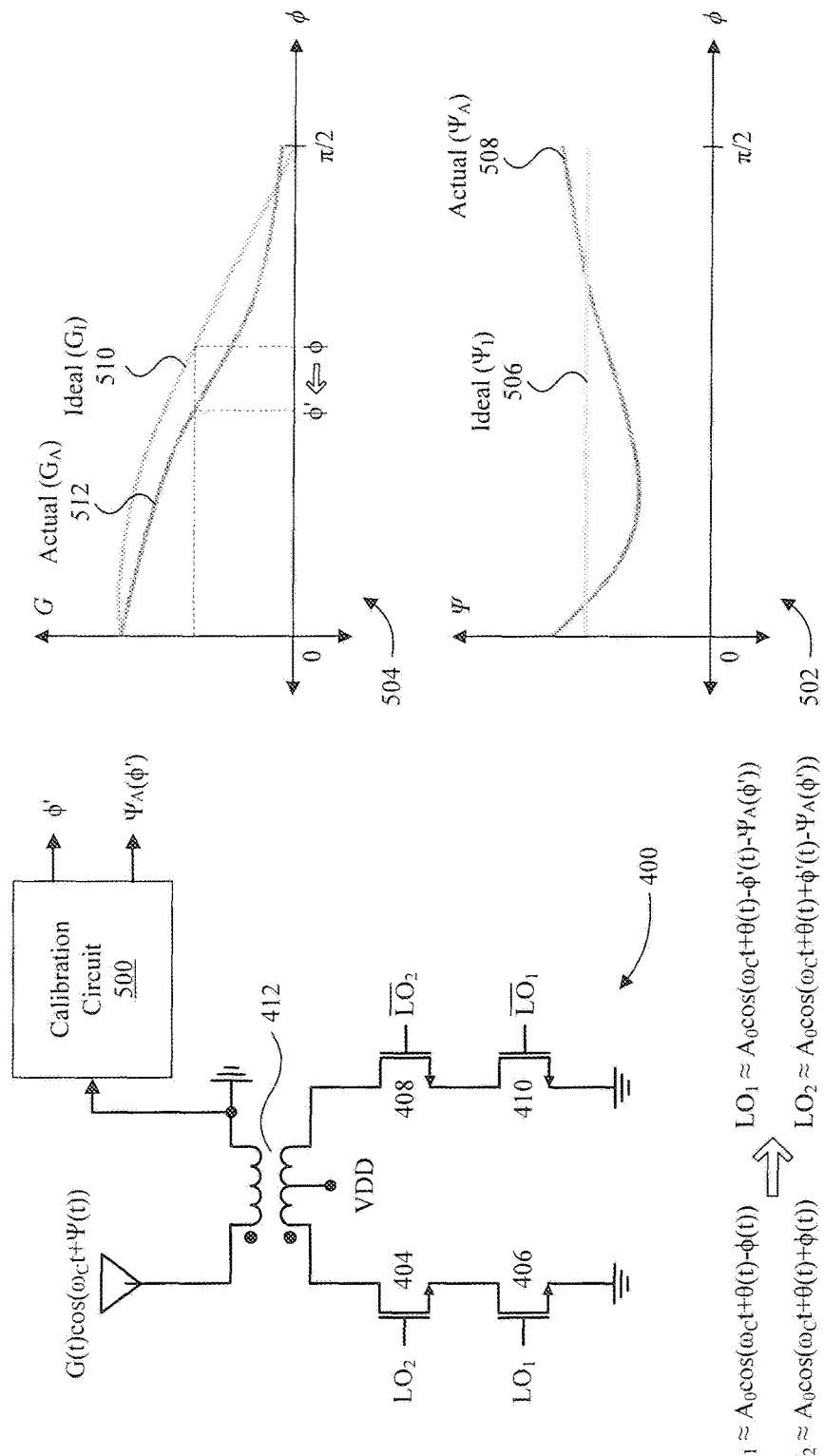

FIG. 5 illustrates a calibration circuit and method for a wireless transmitter front-end that implements the outphasing technique in accordance with embodiments of the present disclosure The present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of this discussion, the term "module" shall be understood to include software, firmware, or hardware (such as one or more circuits, microchips, processors, and/or devices), or any combination thereof. In addition, it will be understood that each module can include one, or more than one, component within an actual device, and each component that forms a part of the described module can function either cooperatively or independently of any other component forming a part of the module. Conversely, multiple modules or nodes described herein can represent a single component within an actual device. Further, components within a module can be in a single device or distributed among multiple devices in a wired or wireless manner.

1. OVERVIEW

Several techniques have been proposed to alleviate the tradeoff between linearity and power efficiency in power amplifiers. One such technique is outphasing, or what may be referred to as linear amplification with nonlinear components (LINC). In an outphasing transmitter, an amplitude and phase modulated signal is decomposed into two constant envelope phase modulated signals. The two constant envelope phase-modulated signals are then amplified by respective non-linear power amplifiers that are power efficient. After amplification, the output power of the power amplifiers are combined to reconstruct the variable-envelope signal (albeit at a higher power level as desired).

Figure 1:
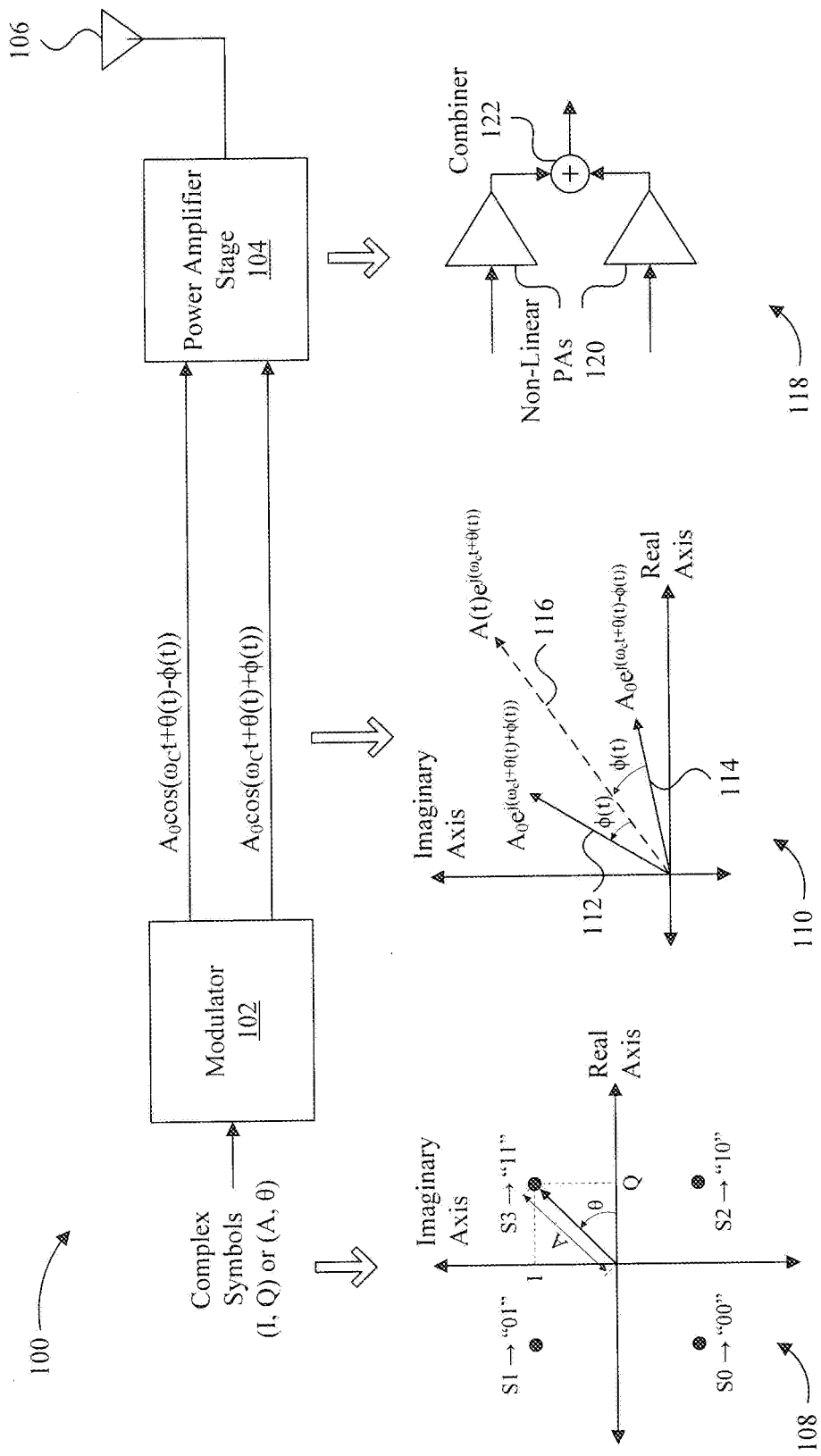
FIG. 1 illustrates a wireless transmitter front-end that implements the outphasing technique.

FIG. 1 illustrates a wireless transmitter front-end 100 that implements the outphasing technique. Wireless transmitter front-end 100 includes a modulator 102, a power amplifier stage 104, and an antenna 106.

Modulator 102 receives a series of complex symbols representing data and modulates the amplitude and phase of a signal based on the received complex symbols. For example, the complex symbols received by modulator 102 can be selected from the constellation 108 shown in FIG. 1. Each complex symbol S1-S4 in constellation 108 represents a unique two-bit pattern and can be provided to modulator 102 in polar form by its amplitude A and phase $\theta$ or in Cartesian form by its in-phase I and quadrature-phase Q components.

A conventional modulator would provide a single, modulated signal as output. The amplitude of the modulated signal would vary over time with the amplitude A of the received complex symbols, and the phase of the signal would vary over time with the phase θ of the received complex symbols. Such a modulated signal can be represented mathematically as:

$$A(t)\cos(\omega_c t+\theta(t)) \quad (1)$$

where $\omega_c$ is the frequency of the signal.

In accordance with the outphasing technique, modulator 102 is configured to decompose this amplitude and phase modulated signal into two constant envelope phase-modulated signals of amplitude $A_0$ and time-varying phases $(\theta(t)-\phi(t))$ and $(\theta(t)+\phi(t))$, where $\theta(t)$ can be referred to as the modulation angle and $\phi(t)$ can be referred to as the outphasing angle. The two constant envelope phase-modulated signals can be represented mathematically as:

$$A_0 \cos(\omega_c t+\theta(t)-\phi(t)) \quad (2)$$

$$A_0 \cos(\omega_c t+\theta(t)+\phi(t)) \quad (3)$$

The outphasing angle $\phi(t)$ is modulated based on the original time-varying amplitude $A(t)$ such that the sum of the two constant envelope phase-modulated signals would result in the reconstruction of the original time-varying modulated signal represented by Eq. (1). In other words, the information encoded by the time-varying amplitude $A(t)$ in Eq. (1) is maintained in the time-varying outphasing angle $\phi(t)$.

To provide such a result, the time-varying outphasing angle $\phi(t)$ can be set equal to $\cos^{-1}(A(t)/2A_0)$. This can be verified mathematically by summing Eq. (2) and Eq. (3) above, which represent the two constant envelope phase-modulated signals, setting the resulting summation equal to Eq. (1) above, which represents the original amplitude and phase modulated signal, and solving for the time-varying outphasing angle $\phi(t)$ as shown below:

$$A_0 \cos(\omega_c t+\theta(t)-\phi(t))+A_0 \cos(\omega_c t+\theta(t)+\phi(t))=A(t)\cos(\omega_c t+\theta(t))$$

$$2A_0 \cos(\omega_c t+\theta(t))\cos(\phi(t))=A(t)\cos(\omega_c t+\theta(t))$$

$$2A_0 \cos(\omega(t))=A(t)$$

$$\cos(\phi(t))=A(t)/2A_0$$

$$\phi(t)=\cos^{-1}(A(t)/2A_0) \quad (4)$$

To further illustrate the outphasing technique, diagram 110 in FIG. 1 provides phasor representations 112 and 114 of the two constant envelope phase-modulated signals and a phasor representation 116 of the original amplitude and phase modulated signal from which the two constant envelope phase-modulated signals are decomposed. As can be seen more easily from diagram 110, the vector sum of phasor representations 112 and 114 would result in phasor representation 116.

It will be appreciated by one of ordinary skill in the art that phasor representations 112, 114, and 116 are simplified phasor representations of the above mentioned signals. In actuality, the above described signals would each be more accurately represented by two phasors rotating in opposite directions with the same length and opposite phase, but only one such phasor is shown in diagram 110 for each of the above described signals for clarity purposes.

After modulator 102 produces the two constant envelope phase-modulated signals, power amplifier stage 104 independently amplifies and combines the two amplified signals. Because the two constant envelope phase-modulated signals have constant amplitudes equal to $A_0$, highly power efficient non-linear power amplifiers can be used. For example, as shown in example implementation 118 of power amplifier stage 104, two non-linear power amplifiers 120 are used to respectively amplify the power of one of the two constant envelope phase-modulated signals provided by modulator 102. A combiner 122 is then used to combine the output power of non-linear power amplifiers 120 to reconstruct the original amplitude and phase modulated signal from which the two constant envelope phase-modulated signals were decomposed (albeit at a higher power level as desired).

Two issues with example implementation 118 are the loss in signal power generally incurred by combiner 122 and added distortions in the signal output by combiner 122. For example, because of gain and phase mismatches between each of non-linear power amplifiers 120, as well as the loading effect each non-linear power amplifiers 120 has on the other, the two constant envelope phase-modulated signals after amplification may not have the expected gain or expected relative phase between them. As a result, the combining of the power of the two constant envelope phase-modulated signals by combiner 122 can result in loss of signal power and added distortions.

The present disclosure is directed to a system and method for performing the outphasing technique without using such a combiner at the output of two power amplifiers to reduce loss and distortions. These and other features of the present disclosure are described further below.

2. OUTPHASING TRANSMITTER WITH AND-CORE POWER AMPLIFIER

As shown above in the derivation of Eq. (4), the time-varying amplitude $A(t)$ of the original phase and amplitude modulated signal represented by Eq. (1) is equal to $2A_0 \cos(\phi(t))$. Thus, in order to reconstruct the original phase and amplitude modulated signal represented by Eq. (1), the method of combining the two constant envelope phase-modulated signals should not only result in a signal with frequency $\omega_c$ and modulation angle $\theta(t)$, but also a signal with an amplitude proportional to $\cos(\phi(t))$.

Figure 2:
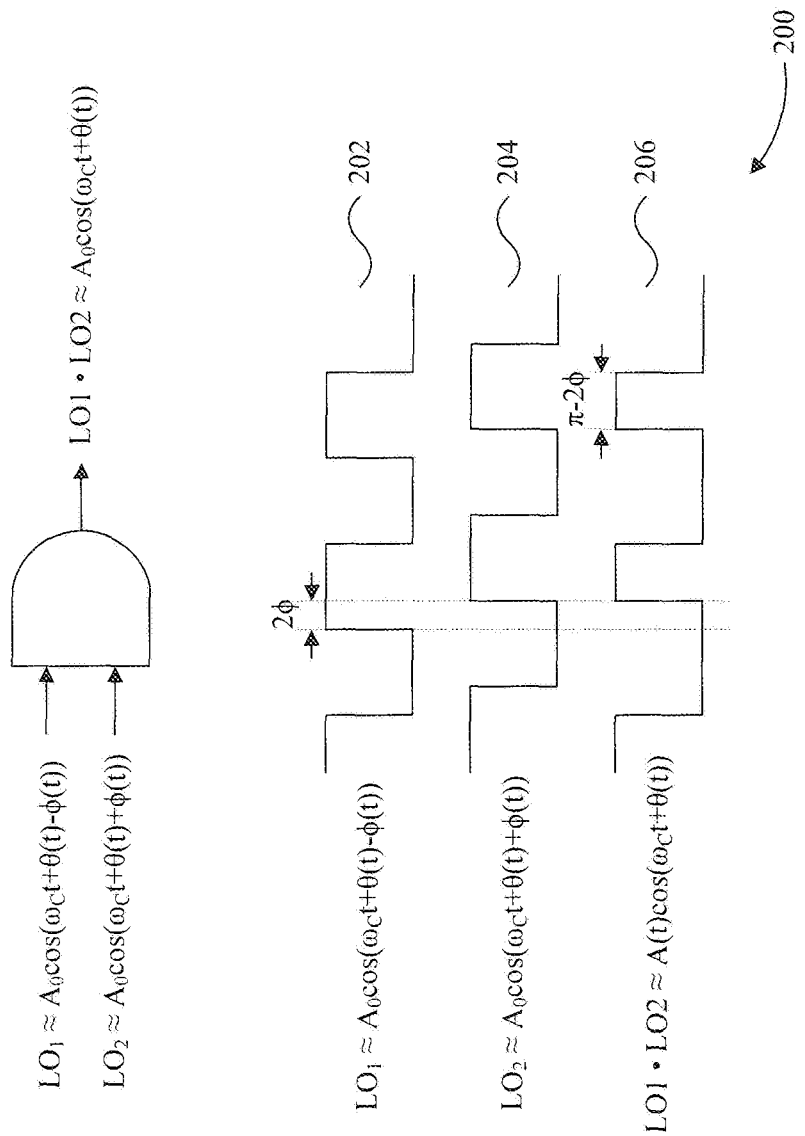
FIG. 2 illustrates one method of combining two constant envelope phase-modulated signals in accordance with embodiments of the present disclosure.

FIG. 2 illustrates one method of combining the two constant envelope phase-modulated signals that results in a signal with frequency $\omega_c$, modulation angle $\theta(t)$, and an amplitude proportional to $\cos(\phi(t))$. In particular, FIG. 2 illustrates a waveform diagram 200 of three signal waveforms 202, 204, and 206.

Signal waveforms 202 and 204 are the signal waveforms of two constant envelope phase-modulated signals denoted $LO_1$ and $LO_2$, respectively. The two constant envelope phase-modulated signals $LO_1$ and $LO_2$ are the same as the two constant envelope phase modulated signals described above in section I (with constant amplitude, frequency $\omega_c$, and time varying phases $(\theta(t)-\phi(t))$ and $(\theta(t)+\phi(t))$), but instead of being sinusoidal, the two constant envelope phase modulated signals $LO_1$ and $LO_2$ are rectangular waves.

Signal waveform 206 is the waveform that results from combining the two constant envelope phase-modulated signals $LO_1$ and $LO_2$ in such a way that the resulting signal, represented by signal waveform 206, has a frequency $\omega_c$, modulation angle $\theta(t)$, and an amplitude proportional to $\cos(\phi(t))$. The two constant envelope phase-modulated signals $LO_1$ and $LO_2$ are specifically combined by taking their logical conjunction. A digital logic AND gate is one device that implements logical conjunction and, as illustrated at the top of FIG. 2, can be used to combine the two constant envelope phase-modulated signals $LO_1$ and $LO_2$ in this manner. As illustrated in FIG. 2, the logical conjunction provides a logic "high" (or logic "1") for the output signal 206 at instances in time where both signals $LO_1$ and $LO_2$ are also both logic "high". Otherwise, the output signal 206 is a logic "low" (or "0").

It can be readily verified, via the Fourier series, that the first harmonic of the signal represented by signal waveform 206 has a frequency $\omega_c$, modulation angle $\theta(t)$, and an amplitude proportional to $\cos(\phi(t))$. Thus, other than a possible DC offset, the first harmonic of the signal represented by signal waveform 206 is the same as the original amplitude and phase modulated signal represented by Eq. (1) above. Accordingly, the original amplitude and phase modulated signal represented by Eq. (1) can be decomposed into the two constant envelope phase-modulated rectangular wave signals $LO_1$ and $LO_2$ and recreated (other than a possible DC offset and incidental noise/non-idealities) by taking the logical conjunction of the first constant envelope phase-modulated rectangular wave signal $LO_1$ and the second constant envelope phase-modulated rectangular wave signal $LO_2$.

Figure 3:
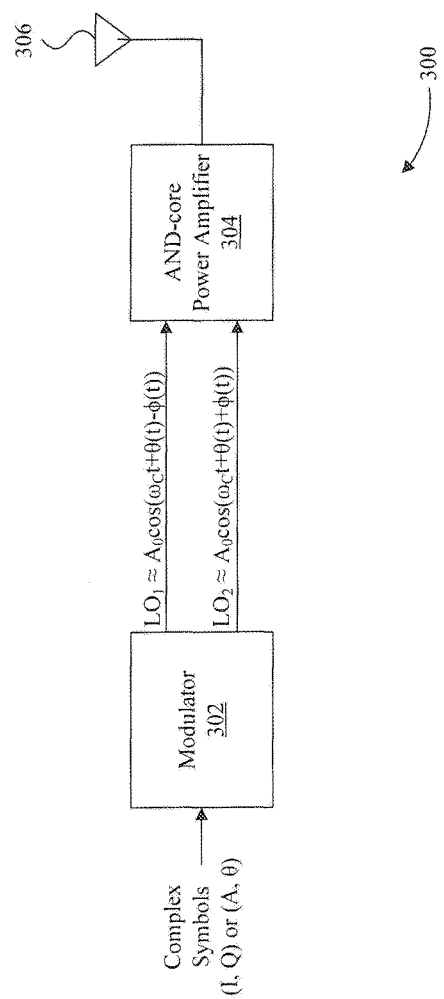
FIG. 3 illustrates another wireless transmitter front-end that implements the outphasing technique in accordance with embodiments of the present disclosure.

Using this method of combining the two constant envelope phase-modulated rectangular wave signals $LO_1$ and $LO_2$ illustrated in FIG. 2, a system and method for performing the outphasing technique without using a combiner at the output of two power amplifiers like the implementation of wireless transmitter front-end 100 in FIG. 1 can be achieved. In particular, FIG. 3 illustrates such a wireless transmitter front-end 300. Wireless transmitter front-end 300 includes a modulator 302, an AND-core power amplifier 304, and an antenna 306.

Modulator 302 receives a series of complex symbols representing data and modulates the amplitude and phase of a signal based on the received complex symbols. For example, the complex symbols received by modulator 302 can be selected from the constellation 108 shown in FIG. 1. Each complex symbol S1-S4 in constellation 108 can be provided to modulator 302 in polar form by its amplitude A and phase $\theta$ or in Cartesian form by its in-phase I and quadrature-phase Q components.

As described above in regard to FIG. 1, a conventional modulator would provide a single, modulated signal as output. The amplitude of the signal would vary over time with the amplitude A of the received complex symbols, and the phase of the signal would vary over time with the phase $\theta$ of the received complex symbols. Such a modulated signal can be represented mathematically by Eq. (1) above.

In accordance with the outphasing technique, modulator 302 is configured to decompose this amplitude and phase modulated signal into two constant envelope phase-modulated rectangular wave signals $LO_1$ and $LO_2$ of time-varying phases $(\theta(t)-\phi(t))$ and $(\theta(t)+\phi(t))$, where again $\theta(t)$ can be referred to as the modulation angle and $\phi(t)$ can be referred to as the outphasing angle. The information encoded by the time-varying amplitude $A(t)$ is maintained in the time-varying outphasing angle $\phi(t)$, which can be determined according to Eq. (4) discussed above.

AND-core power amplifier 304 is configured to reconstruct and amplify the original signal from the two constant envelope phase-modulated rectangular wave signals $LO_1$ and $LO_2$ using a non-linear PA (e.g., a class B, class C, class D, class E, or class F power amplifier) that can provide high power efficiencies. AND-core power amplifier 304 specifically reconstructs the original signal (other than a possible DC offset and incidental noise/non-idealities) by taking the logical conjunction of the first constant envelope phase-modulated rectangular wave signal $LO_1$ and the second constant envelope phase-modulated rectangular wave signal $LO_2$. The reconstruction is generally performed in combination with the amplification. The reconstructed and amplified original signal can then be transmitted by antenna 306 over a channel to a receiver.

Because AND-core power amplifier 304 uses a single power amplifier and does not use a combiner at the output of two power amplifiers to combine the two constant envelope phase-modulated rectangular wave signals $LO_1$ and $LO_2$, wireless transmitter front-end 300 does not suffer from the same loss and distortion issues as wireless transmitter front-end 100 described above in regard to FIG. 1.

Figure 4:
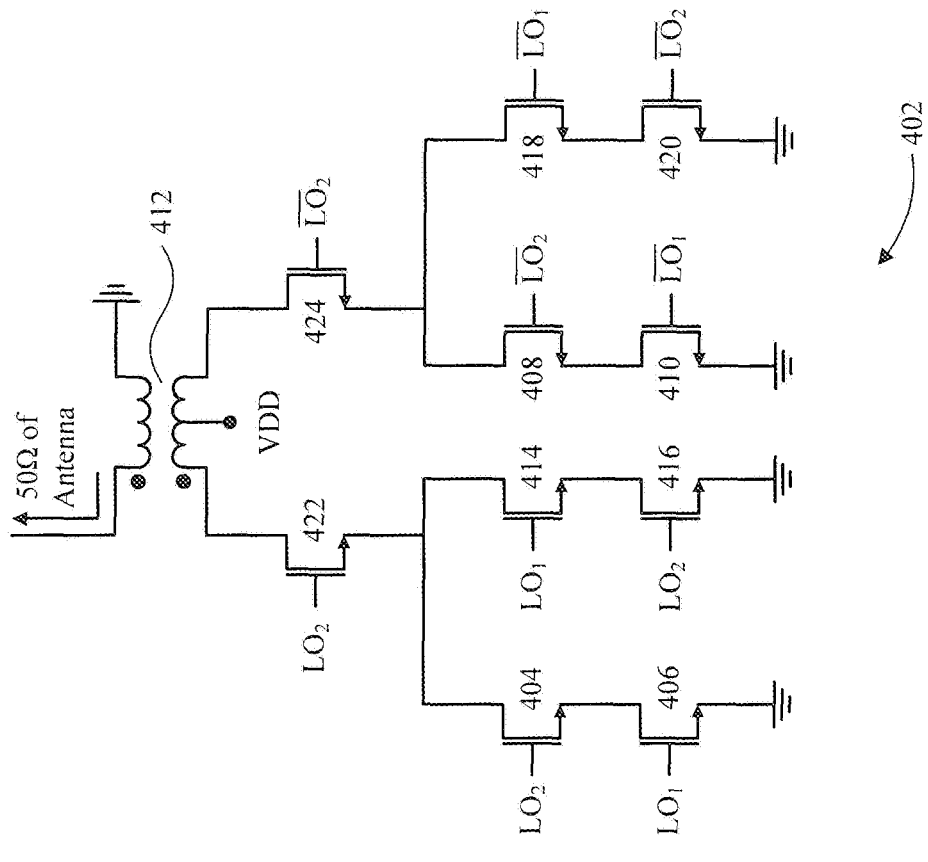
FIG. 4 illustrates two example implementations of an AND-core power amplifier in accordance with embodiments of the present disclosure.
Figure 4:
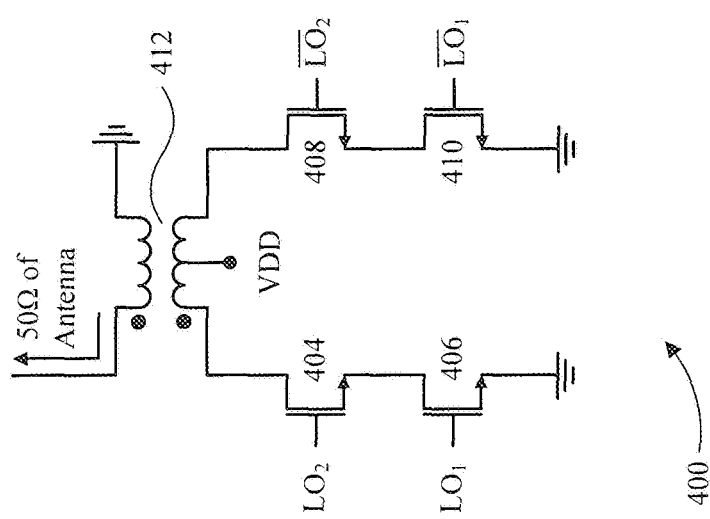

FIG. 4 illustrates two example implementations 400 and 402 of AND-core power amplifier 304 in FIG. 3. Example implementations 400 and 402 are both configured as highly efficient class-D power amplifiers.

As shown in FIG. 4, example implementation 400 has two sets of series coupled transistors. The first set includes n-type metal oxide semiconductor field effect transistors (MOSFETs) 404 and 406 that are coupled between ground (or some other possible voltage potential) and a first-end of a primary winding of a balun 412. The gates of the first set of two series coupled transistors 404 and 406 are respectively coupled to the first constant-envelope rectangular wave signal $LO_1$ and the second constant-envelope rectangular wave signal $LO_2$. Transistors 404 and 406 operate as switches, and switch back and forth between a conductive and nonconductive state based on the constant-envelope rectangular wave signals $LO_1$ and $LO_2$ coupled to their gates.

The series coupling of the two transistors 404 and 406 performs the desired logical conjunction of the two constant envelope phase-modulated rectangular wave signals $LO_1$ and $LO_2$. Example implementation 400 amplifies the result of this logical conjunction by converting DC power drawn from DC voltage source VDD, which is coupled to a center node of the primary winding of balun 412, into an AC voltage signal delivered to the load, which in this case is a 50 Ohm antenna.

The second set of transistors includes n-type MOSFETs 408 and 410 that are coupled between ground (or some other possible voltage potential) and a second-end of the primary winding of balun 412. The gates of the second set of two series coupled transistors 408 and 410 are respectively coupled to the compliment of the first constant-envelope rectangular wave signal $LO_1$ and the compliment of the second constant-envelope rectangular wave signal $LO_2$. Transistors 408 and 410 operate as switches, and switch back and forth between a conductive and nonconductive state based on the complement of the constant-envelope rectangular wave signals $LO_1$ and $LO_2$ coupled to their gates.

The series coupling of the two transistors 408 and 410 perform the desired logical conjunction of the compliments of the two constant envelope phase-modulated rectangular wave signals $LO_1$ and $LO_2$. Example implementation 400 amplifies the result of this logical conjunction by converting DC power drawn from DC voltage source VDD, which is coupled to a center node of the primary winding of balun 412, into an AC voltage signal delivered to the load, which in this case is a 50 Ohm antenna.

Although not show in FIG. 4, an example implementation may further include a cascode stage between the two sets of series coupled transistors and balun 412 to prevent high-voltage breakdown of the transistors within the two sets of series coupled transistors.

Example implementation 402 has a similar configuration as example implementation 400, but with the addition of a cascode stage and additional series coupled transistor sets to provide a more balanced load among the devices generating rectangular wave signals $LO_1$, $LO_2$ and their respective complements. More specifically, transistors 422 and 424 are used as a cascode stage to prevent potential high-voltage breakdown of the other transistors shown in example implementation 402, whereas series coupled transistors 414 and 416 and series coupled transistors 418 and 420 balance the load among the devices (e.g., digitally controlled oscillators in modulator 302) generating rectangular wave signals $LO_1$, $LO_2$ and their respective complements.

3. CALIBRATION

Referring now to FIG. 5, a calibration circuit 500 is illustrated in connection with example AND-core power amplifier implementation 400 in FIG. 4. In general, calibration circuit 500 can be used in connection with any AND-core power amplifier implementation within an outphasing transmitter front-end. Calibration circuit 500 is configured to adjust the respective phases of the constant envelope phase-modulated rectangular wave signals $LO_1$ and $LO_2$ to calibrate the amplitude G and phase Ψ of the output signal provided to the antenna by example AND-core power amplifier implementation 400.

Calibration circuit 500 is configured to sweep ϕ of the constant envelope phase-modulated rectangular wave signals $LO_1$ and $LO_2$ over a range of values (e.g., from 0 to π/2), while maintaining a constant θ, and measure the amplitude G and phase Ψ of the output signal over the range of values for ϕ.

Waveform 502 shows the ideal phase $Ψ_I$ 506 of the output signal over the range of values of ϕ and the measured or actual phase $Ψ_A$ 508 of the output signal over the range of values of ϕ. Given that the ideal phase $Ψ_I$ 506 is constant across the range of values of ϕ, the measured or actual phase $Ψ_A$ 508 (or some value proportional thereto) can simply be subtracted from the phases of the constant envelope phase-modulated rectangular wave signals $LO_1$ and $LO_2$ to provide appropriate compensation. Calibration circuit 500 can provide the measured or actual phase $Ψ_A$ 508 or some value proportional thereto) to modulator 302, shown in FIG. 3, to perform the subtraction.

Waveform 504 shows the ideal amplitude $G_I$ 510 of the output signal over the range of values of ϕ and the measured or actual amplitude $G_A$ 512 of the output signal over the range of values of ϕ. To compensate for the difference between the ideal amplitude $G_I$ 510 of the output signal and the actual amplitude $G_A$ 512 of the output signal, calibration circuit 500 can further map ϕ to ϕ' based on the measured value of actual amplitude $G_A$ 512 at ϕ' corresponding to the ideal amplitude $G_I$ 510 at ϕ. Calibration circuit 500 can provide ϕ' for a given ϕ to modulator 302, shown in FIG. 3, to substitute ϕ' for ϕ. For example, calibration circuit 500 can implement a lookup table to provide the mapping from ϕ to ϕ'.

At the bottom of FIG. 5, the two adjusted constant envelope phase-modulated rectangular wave signals $LO_1$ and $LO_2$ are provided. The phases of the two constant envelope phase-modulated rectangular wave signals $LO_1$ and $LO_2$ have specifically been adjusted to calibrate the amplitude G and phase Ψ of the output signal provided to the antenna by example AND-core power amplifier implementation 400.

4. CONCLUSION

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

What is claimed is:

1. A transmitter front-end, comprising:
    a modulator configured to produce a first constant-envelope rectangular wave signal of amplitude $A_0$ and phase (θ−ϕ) and a second constant-envelope rectangular wave signal of amplitude $A_0$ and phase (θ+ϕ), where θ is a modulation angle and ϕ is an outphasing angle; and
    a power amplifier configured to amplify a logical conjunction of the first constant-envelope rectangular wave signal and the second constant-envelope rectangular wave signal to provide an output signal, wherein the power amplifier comprises at least two series coupled switches configured to provide the logical conjunction of the first constant-envelope rectangular wave signal and the second constant-envelope rectangular wave signal.

2. The transmitter front-end of claim 1, wherein the power amplifier is a class-D power amplifier.

3. The transmitter front-end of claim 1, wherein the at least two series coupled switches comprise:
    a first set of two series transistors coupled between ground and a first end of a primary winding of a balun; and
    a second set of two series transistors coupled between ground and a second end of the primary winding of the balun.

4. The transmitter front-end of claim 3, wherein gates of the first set of two series transistors are respectively coupled to the first constant-envelope rectangular wave signal and the second constant-envelope rectangular wave signal.

5. The transmitter front-end of claim 3, wherein gates of the second set of two series transistors are respectively coupled to a complement of the first constant-envelope rectangular wave signal and a complement of the second constant-envelope rectangular wave signal.

6. The transmitter front-end of claim 1, further comprising:
    a calibration circuit configured to sweep ϕ over a range of values and measure amplitude A and phase Ψ of the output signal over the range of values for ϕ.

7. The transmitter front-end of claim 6, wherein the calibration circuit is further configured to subtract, for a given value of ϕ, a value proportional to the measured value of Ψ at the given value of ϕ from the first constant-envelope rectangular wave signal and the second constant-envelope rectangular wave signal.

8. The transmitter front-end of claim 6, wherein the calibration circuit is further configured to map $\phi$ to $\phi'$ based on the measured value of A at $\phi'$ corresponding to a desired value of A at $\phi$.

9. A transmitter front-end, comprising:
a modulator configured to produce a first constant-envelope rectangular wave signal of amplitude $A_0$ and phase $(\theta-\phi)$ and a second constant-envelope rectangular wave signal of amplitude $A_0$ and phase $(\theta+\phi)$, where $\theta$ is a modulation angle and $\phi$ is an outphasing angle;
a power amplifier configured to amplify a logical conjunction of the first constant-envelope rectangular wave signal and the second constant-envelope rectangular wave signal to provide an output signal, wherein the power amplifier comprises at least two series coupled switches configured to provide the logical conjunction of the first constant-envelope rectangular wave signal and the second constant-envelope rectangular wave signal; and
a calibration circuit configured to calibrate an amplitude A and phase $\Psi$ of the output signal by adjusting $\phi$.

10. The transmitter front-end of claim 9, wherein the power amplifier is a class-D power amplifier.

11. The transmitter front-end of claim 9, wherein the at least two series coupled switches comprise:
a first set of two series transistors coupled between ground and a first end of a primary winding of a balun; and
a second set of two series transistors coupled between ground and a second end of the primary winding of the balun.

12. The transmitter front-end of claim 11, wherein gates of the first set of two series transistors are respectively coupled to the first constant-envelope rectangular wave signal and the second constant-envelope rectangular wave signal.

13. The transmitter front-end of claim 11, wherein gates of the second set of two series transistors are respectively coupled to a complement of the first constant-envelope rectangular wave signal and a complement of the second constant-envelope rectangular wave signal.

14. The transmitter front-end of claim 11, wherein the calibration circuit is further configured to sweep $\phi$ over a range of values and measure A and $\Psi$ over the range of values for $\phi$.

15. The transmitter front-end of claim 14, wherein the calibration circuit is further configured to subtract, for a given value of $\phi$, a value proportional to the measured value of $\Psi$ at the given value of $\phi$ from the first constant-envelope rectangular wave signal and the second constant-envelope rectangular wave signal.

16. The transmitter front-end of claim 14, wherein the calibration circuit is further configured to map $\phi$ to $\phi'$ based on the measured value of A at $\phi'$ corresponding to a desired value of A at $\phi$.

17. A method, comprising:
producing a first constant-envelope rectangular wave signal of amplitude $A_0$ and phase $(\theta-\phi)$, where $\theta$ is a modulation angle and $\phi$ is an outphasing angle;
producing a second constant-envelope rectangular wave signal of amplitude $A_0$ and phase $(\theta+\phi)$; and
amplifying, using a power amplifier, a logical conjunction of the first constant-envelope rectangular wave signal and the second constant-envelope rectangular wave signal to provide an output signal,
wherein the logical conjunction of the first constant-envelope rectangular wave signal and the second constant-envelope rectangular wave signal is provided by at least two series coupled switches of the power amplifier.

18. The method of claim 17, further comprising:
sweeping $\phi$ over a range of values; and
measuring amplitude A and phase $\Psi$ of the output signal over the range of values for $\phi$.

19. The method of claim 18, further comprising:
subtracting, for a given value of $\phi$, a value proportional to the measured value of $\Psi$ at the given value of $\phi$ from the first constant-envelope rectangular wave signal and the second constant-envelope rectangular wave signal.

20. The method of claim 18, further comprising:
mapping $\phi$ to $\phi'$ based on the measured value of A at $\phi'$ corresponding to a desired value of A at $\phi$.

* * * * *